United States Patent
Bornhof et al.

(10) Patent No.: US 8,757,415 B2
(45) Date of Patent: Jun. 24, 2014

(54) HOUSING FOR AN ELECTRONIC OR MECHTRONIC UNIT INCLUDING SEAL WITH PRESSURE RELIEF DEVICE

(75) Inventors: Hans-Ulrich Bornhof, Burgwedel (DE); Heinrich Diekmeyer, Barsinghausen (DE); Detlev Eggebrecht, Hannover (DE)

(73) Assignee: WABCO GmbH, Hannover (DE)

( * ) Notice: Subject to any disclaimer, the term of this patent is extended or adjusted under 35 U.S.C. 154(b) by 1912 days.

(21) Appl. No.: 11/132,723

(22) Filed: May 19, 2005

(65) Prior Publication Data

US 2005/0269321 A1   Dec. 8, 2005

(30) Foreign Application Priority Data

Jun. 4, 2004   (DE) .......................... 10 2004 028 199

(51) Int. Cl.
*B65D 51/16* (2006.01)

(52) U.S. Cl.
USPC ................. 220/203.01; 220/202; 220/203.09; 220/203.11; 277/928; 277/640; 277/637; 277/647

(58) Field of Classification Search
USPC ................. 277/928, 640, 637, 647; 220/4.21, 220/203.27–203.29, 203.01, 203.02, 220/203.09, 203.12, 374, 373, 367.1, 366.1, 220/378, 849, 203.19, 203.11; 137/854
See application file for complete search history.

(56) References Cited

U.S. PATENT DOCUMENTS

| | | | | |
|---|---|---|---|---|
| 3,290,047 A * | 12/1966 | Mayer | ........................... | 277/647 |
| 4,733,795 A * | 3/1988 | Boehm | ........................ | 220/316 |
| 5,187,621 A * | 2/1993 | Tacklind | .................... | 360/97.02 |
| 5,722,765 A * | 3/1998 | Maglica | ....................... | 362/207 |
| 6,158,745 A * | 12/2000 | Deighton | ...................... | 277/634 |
| 6,536,775 B1 * | 3/2003 | Inciong | ......................... | 277/596 |
| 6,640,645 B2 | 11/2003 | Groger | | |
| 6,766,823 B2 * | 7/2004 | Hong | ............................ | 137/514 |
| 7,413,099 B2 * | 8/2008 | Takahashi et al. | ............ | 220/806 |
| 7,578,407 B2 * | 8/2009 | Tieben et al. | ................. | 220/326 |
| 2004/0011793 A1 * | 1/2004 | Feigel et al. | .................. | 220/303 |
| 2004/0094554 A1 * | 5/2004 | Grybush et al. | ............ | 220/366.1 |

FOREIGN PATENT DOCUMENTS

| | | |
|---|---|---|
| DE | 197 04 532 A1 | 8/1998 |
| DE | 299 18 158 U1 | 2/2000 |
| DE | 100 22 124 A1 | 11/2001 |
| DE | 101 51 413 A1 | 8/2003 |
| EP | 07 72 959 B1 | 5/1997 |
| EP | 0 961 534 A1 | 12/1999 |
| EP | 1 022 507 A2 | 7/2000 |
| FR | 2 831 384 A1 | 4/2003 |

* cited by examiner

Primary Examiner — J. Gregory Pickett
Assistant Examiner — Blaine Neway
(74) Attorney, Agent, or Firm — Kramer Levin Naftalis & Frankel LLP

(57) ABSTRACT

A device housing, especially for accommodating an electronic unit or a mechatronic unit, has parts which are sealed against one another in assembled condition via an encircling, stationary seal. At least one pressure-relief device is integrated into the seal for admission of air into the housing. The seal is formed at least in part as a lip that opens under overpressure conditions inside the housing. To allow any water that has penetrated to flow away, the housing is mounted vertically, with the pressure-relief device disposed at the bottom.

28 Claims, 4 Drawing Sheets

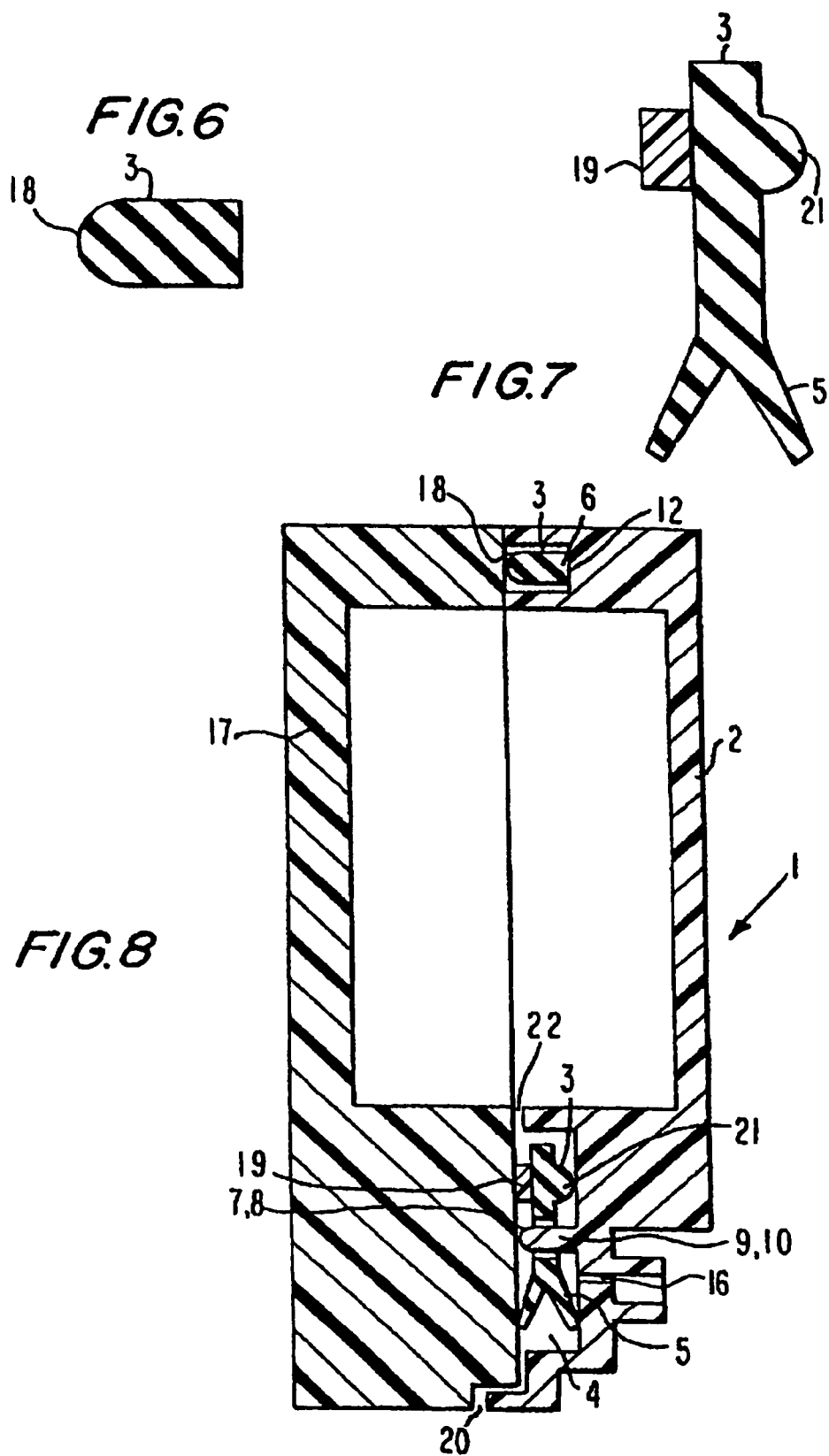

HOUSING FOR AN ELECTRONIC OR MECHTRONIC UNIT INCLUDING SEAL WITH PRESSURE RELIEF DEVICE

BACKGROUND OF THE INVENTION

The present invention relates generally to a device housing, and, more particularly, to a housing for an electronic unit or a mechatronic unit. The present invention has particular application in vehicle systems.

Large numbers of housings for electronic and mechatronic units are routinely manufactured, and so they must be capable of being manufactured at a favorable cost. In addition, however, adequate protection of the electronic or mechatronic unit disposed in the housing must also be ensured, especially for service under difficult ambient conditions, such as in motor vehicles. In particular, uncontrolled ingress of water into the housing must be prevented. For this purpose, the housing is typically equipped with an encircling, statically designed, elastic seal, which seals a top part against a bottom part of the housing in the assembled condition.

Furthermore, it is advantageous for the housing to be capable of controlled air exchange with the surrounding atmosphere ("breathing"). This serves to prevent condensation from forming in the interior of the housing under fluctuating ambient temperatures. In mechatronic units, which may operate with injection of compressed air into the housing, this also serves to prevent potentially harmful overpressure in the housing.

DE 19704532 A1 as well as EP 0772959 B1 describe watertight housings composed of a top part and a bottom part, wherein the two parts in assembled condition are sealed against one another by an encircling seal. This arrangement prevents the ingress of dirty water into the housing. However, conventional housings for electronic and mechatronic units do not have any openings to atmosphere that permit a breathing process.

DE 10022124 A1 describes a housing for a control unit, especially a mechatronic unit, which is provided with a pressure-relief bore for venting or admitting air. This arrangement prevents condensation from forming in the housing and also maintains the pressure in the interior space at atmospheric pressure. This arrangement also prevents a pressure rise in the interior space of the housing in the event of a leak from a compressed-air supply to a pressure sensor. The housing described in DE 10022124 A1, however, suffers from the disadvantage that dirty water can reach the interior space through the bore. As a result, sensitive components can be damaged.

Accordingly, it is desired to provide a device housing, especially for an electronic unit or a mechatronic unit, that protects against the ingress of dirty water and, at the same time, permits rapid pressure relief to atmosphere in the event of an overpressure condition in the housing.

SUMMARY OF THE INVENTION

Generally speaking, it is an object of the present invention to provide a housing for an electronic unit or a mechatronic unit that avoids the disadvantages of conventional housings.

The housing according to the present invention integrates a pressure-relief device in an encircling seal between top and bottom parts of the housing. By virtue of a labyrinth effect, extensive sealing of the housing against external dirty water is achieved, while, by virtue of a lip, rapid discharge of overpressure from the interior space to atmosphere is also permitted. The present invention avoids the need for special devices such as overpressure valves, allowing the inventive housing to be manufactured inexpensively.

Still other objects and advantages of the present invention will in part be obvious and will in part be apparent from the specification.

The present invention accordingly comprises the features of construction, combination of elements, and arrangements of parts which will be exemplified in the construction hereinafter set forth, and the scope of the invention will be indicated in the claims.

BRIEF DESCRIPTION OF THE DRAWINGS

For a fuller understanding of the present invention, reference is had to the following description taken in connection with the accompanying drawings in which:

FIG. 6 is a cross-sectional view of an encircling seal in a static region in accordance with an embodiment of the present invention;

FIG. 7 is a cross sectional view of an encircling seal in a region of a pressure-relief device in accordance with an embodiment of the present invention; and FIG. 8 is a cross sectional view of a housing in assembled condition with an encircling seal lodged in place in accordance with an embodiment of the present invention.

DETAILED DESCRIPTION OF THE PREFERRED EMBODIMENTS

Figure 1:
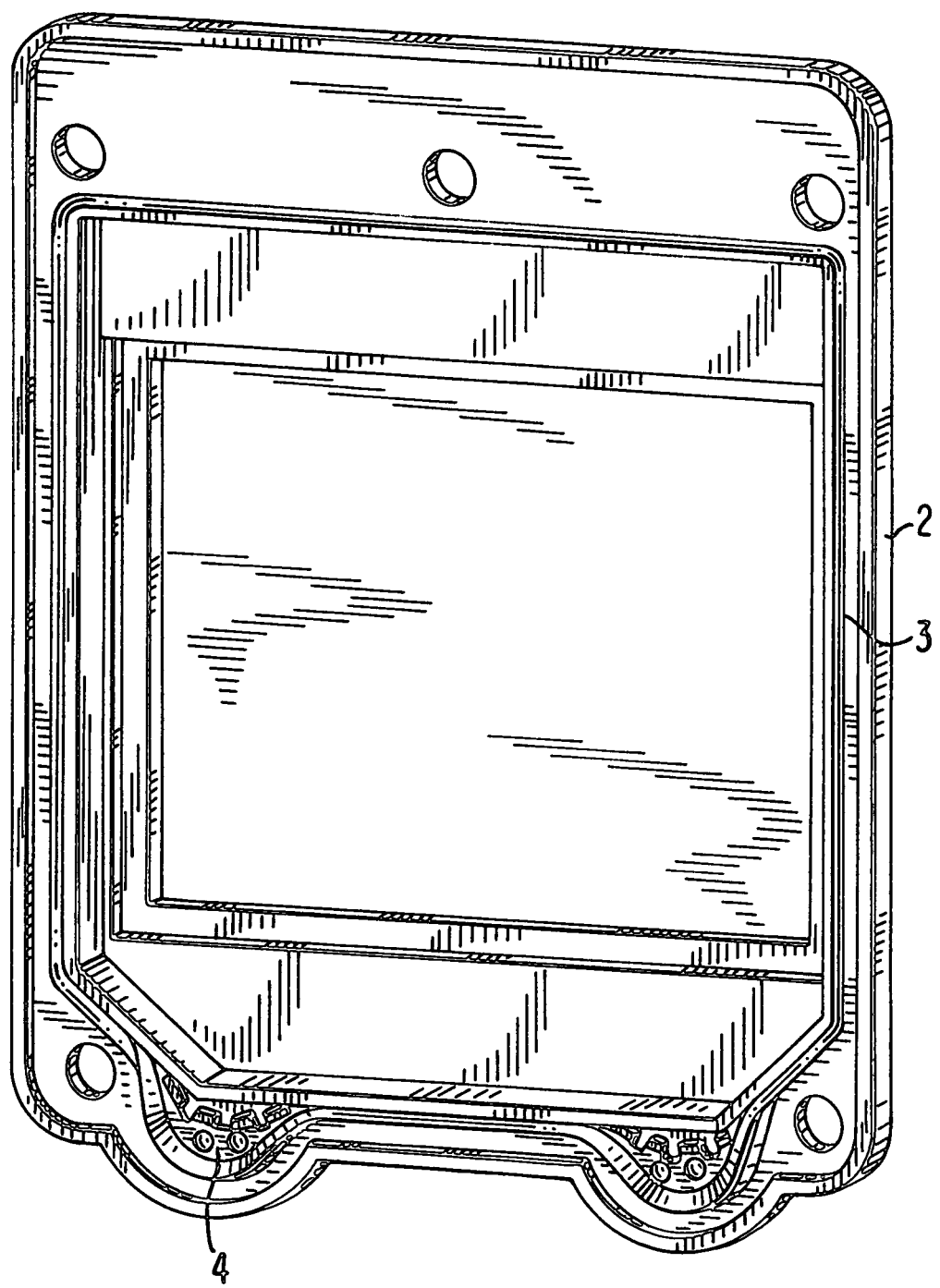
FIG. 1 depicts a part of a housing according to an embodiment of the present invention with an encircling seal lodged in place.

Referring to the drawing figures, where like reference numerals are used for corresponding parts, FIG. 1 is a perspective view of a "bottom" part (2) of a housing (1) for an electronic unit or a mechatronic unit. An encircling seal (3) is shown lodged in a groove (12) defined in the housing (compare with FIG. 2).

Although housing (1) is generally designed for installation and use in vertical position with a pressure-relief device (4) disposed at the bottom, (see FIG. 8), for ease of explanation, the terms "top" part and "bottom" part of the housing will hereinafter be used to refer to the housing parts (17) and (2), respectively, shown mounted side-by-side in FIG. 8. Parts (17) and (2) may also be referred to as "side" parts.

Seal (3) is preferably formed from an elastic material, such as rubber or plastic, for example. Mechanical, pneumatic and electronic components can be disposed in known manner in the interior of housing (1). Seal (3) is provided with two pressure-relief devices (4) which will be described in greater detail hereinafter.

Figure 2:
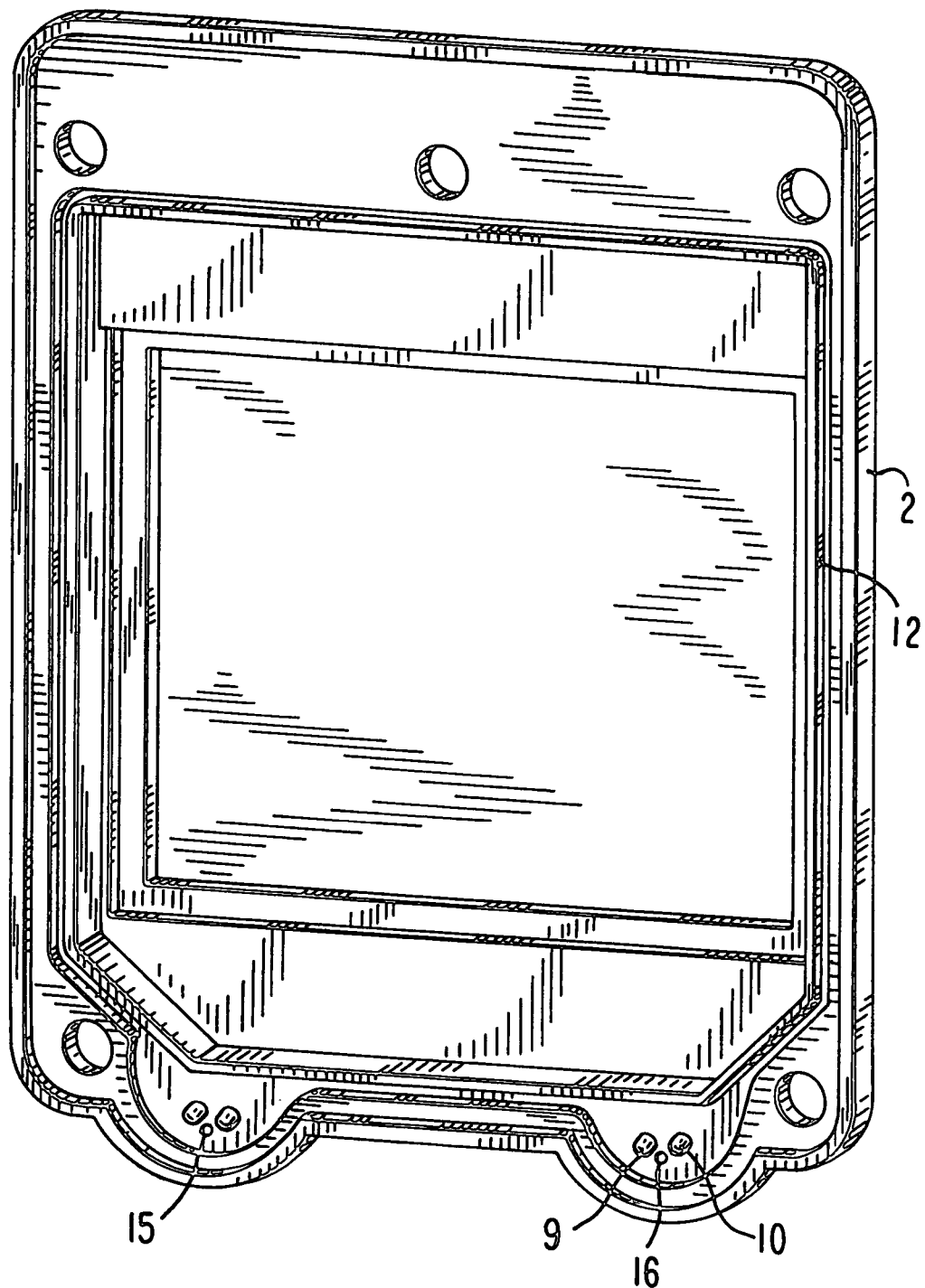
FIG. 2 depicts the part of the housing according to FIG. 1 without an encircling seal lodged in place.

FIG. 2 depicts the bottom part (2) of housing (1) as shown in FIG. 1, but without seal (3) lodged in place. Groove (12) is defined in the bottom part of the housing and widens to become semicircular in shape at two places—i.e., where the two pressure-relief devices (4) are disposed (see e.g., FIGS. 1 and 3). These devices (4) are fixed in place, e.g., by means of retaining pins (9, 10) which engage through corresponding perforations (7, 8) in the seal (3) (see e.g., FIGS. 4 and 8).

FIG. 2 further shows two breathing bores (15, 16) disposed in bottom part (2) of housing (1) and which open from outside into pressure-relief devices (4) from the underside or from the side thereof. Bores (15, 16) can be used in known manner to test the ability of the housing to resist leaks. They also permit air exchange or a "breathing" process between the interior space of housing (1) and the surrounding atmosphere under fluctuating ambient temperatures.

Figure 3:
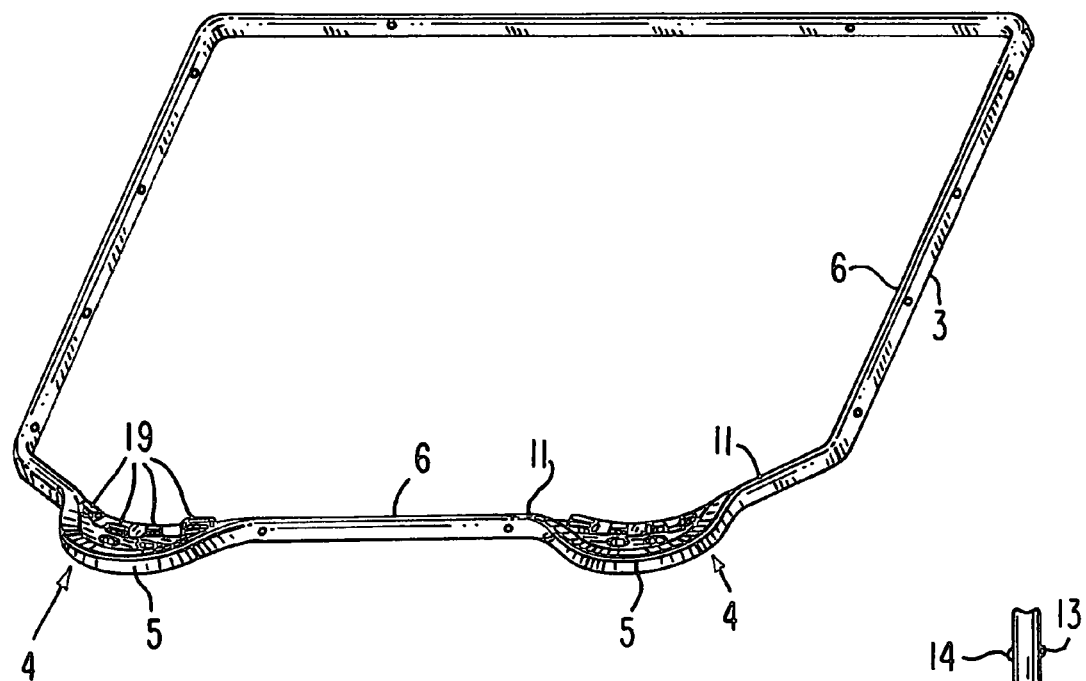
FIG. 3 depicts an encircling seal with integrated pressure-relief devices in accordance with an embodiment of the present invention.

In FIG. 3, encircling seal (3) is depicted by itself. Seal (3) includes a static part (6). The static part (6) of seal (3) is depicted in cross section in FIG. 6.

In the bottom part, seal (3) has two pressure-relief devices (4) which are equipped on the underside or outside with a V-shaped elastic lip (5) (see FIG. 7). A transition (11) between static part (6) of seal (3) and lip (5) is a preferably continuous structure with constant profile height. Lip (5) has a double-edge structure (see FIG. 7). In contrast, the static part (6) of seal (3) has a rectangular shape with one rounded narrow side (18) (see FIG. 6).

Along the inner periphery of the seal in the region of pressure-relief devices (4) there are disposed a plurality of protuberances (19) between which air can pass.

Figure 4:
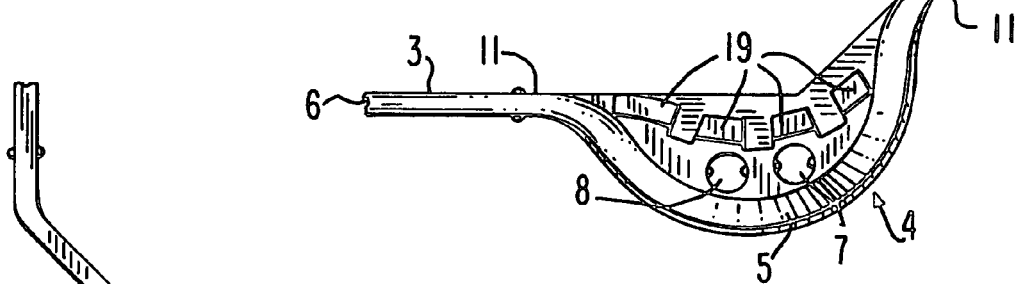
FIG. 4 is an enlarged view of a pressure-relief device in accordance with an embodiment of the present invention.

FIG. 4 is an enlarged view of one of the pressure-relief devices (4). Perforations (7, 8) function, as indicated above, to accommodate retaining pins (9, 10) (see FIG. 2) and thus to fix pressure-relief device (4) in place.

Between discrete protuberances (19) it is possible for air to pass through (labyrinth seal)—not only from the housing interior to the outside but also in the opposite direction. Protuberances (19) also function as support for a bead portion (21) (see FIG. 5) on the back side of the seal and for fixing the pressure-relief devices in place.

In its static part, seal (3) is further provided with knobs (13, 14) which are distributed over its periphery and prevent seal (3) from falling out of groove (12) during assembly. Moreover, centering of seal (3) in groove (12) is achieved by knobs (13, 14).

Figure 5:
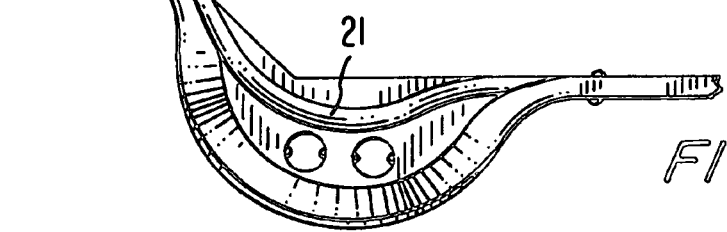
FIG. 5 is a rear view of the pressure-relief device depicted in FIG. 4.

FIG. 5 shows one of the pressure-relief devices (4) from FIG. 4 from the back side, together with bead (21).

FIG. 6 shows, as indicated above, seal (3) in cross section in the static region. Here, seal (3) has a rectangular shape with a rounded narrow side (18).

FIG. 7 shows seal (3) in cross section in the region of one of the pressure-relief devices (4). As shown, lip (5) has a preferably double-edged structure. It is also possible, however, for lip (5) to have a single-edged structure. In such case, the other side is formed as a bead. FIG. 7 further shows one of the protuberances (19) and the oppositely disposed bead (21).

FIG. 8 is a cross-sectional view of housing (1) in assembled condition with seal (3) lodged in place. As indicated above, the housing is disposed vertically with pressure-relief devices (4) at the bottom. Encircling seal (3) seals bottom part (2) of the housing against top part (17) of the housing. In the region of the pressure-relief devices (4), the seal is equipped in its outer part with a double-edged lip (5), as described above. This prevents ingress of dirty water from the outside, but permits pressure relief from the inside to the outside.

As indicated above, lip (5) is fixed by at least one retaining pin (9, 10). Retaining pins (9, 10) can also be attached to top part (17) of housing (1).

For pressure tests and also for air exchange, the bottom part of housing (1) is equipped with at least one breathing bore (15, 16) which opens in the region of lip (5). Breathing bores can also be provided in top part (17) of the housing.

At least in the region of pressure-relief devices (4), housing (1) has one or more steps (20) structured and spaced relative to one another in such a way that they define a stepped gap or labyrinth structure between opposing sides. This labyrinth formation further inhibits the ingress of dirt into the region of lip (5).

It should be appreciated that one or more boards for mounting electronic and/or mechatronic components can be disposed in the interior of housing (1).

The functional principle of the inventive electronic or mechatronic housing will now be described in greater detail with reference to FIG. 8.

Should an overpressure condition present itself in the interior of housing (1) due to a leak in a pneumatic line, for example, pressure can easily be released to the outside by squeezing elastic lip (5) together. In contrast, while lip (5) is spread apart, ingress of air in the opposite direction is prevented. Nevertheless, such ingress of outside air for breathing purposes is permitted by the breathing bores (15, 16).

The labyrinth effect of housing (1) opposing ingress of dirty water is achieved because the water must first penetrate through the breathing bores (15, 16) into the space between lip (5) and bead (21). From there it can penetrate into the neighboring cavity only through the narrow gaps between retaining pins (9, 10) and perforations (7, 8). The water must then pass further through the perforations between protuberances (19) and then through a narrow gap (22) between the two housing halves in order to reach the interior space of the housing.

The weight of the water that has penetrated in this way into the interior of housing (1) then acts on the two lips (5) provided at the lowest point of the housing in such a way that the lips are squeezed together and the water is again released into the surroundings. In this way, rapid drainage of the housing is achieved.

Housing (1) can also be designed such that it has a frame-like middle part, which contains a board on which electronic as well as mechatronic components are mounted. On this middle part there can then be placed, as sealing members, the two housing halves or bottom part (2) and top part (17) shown in FIG. 8. In this case, seal (3) described hereinabove can be mounted on both sides of the middle part.

Accordingly, the present invention provides a housing, especially for an electronic unit or a mechatronic unit, that is protected against the ingress of dirty water while, at the same time, permitting rapid pressure relief to atmosphere in the event of an overpressure condition in the housing.

It will thus be seen that the objects set forth above, among those made apparent from the preceding description, are efficiently attained, and since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A housing comprising:
a first housing part;
a second housing part, the first and second housing parts defining an interior volume therebetween;
at least one breathing bore defined in one of the first and second housing parts; and a seal operable to seal the first housing part with respect to the second housing part, the seal comprising at least one integral pressure relief device including:
a bead portion disposed along a first side;
protuberances disposed along a second side such that air can pass between the protuberances;
at least one perforation sized to receive a retaining device to retain the at least one integral pressure relief device in place; and
an elastic lip operable as a check valve moveable to an open position by over-pressure in an interior space defined between the first and second housing parts.

2. The housing of claim 1, wherein the at least one integral pressure relief device has a substantially semi-circular periphery.

3. The housing of claim 1, wherein the elastic lip has a substantially v-shaped cross section.

4. The housing of claim 1, wherein the elastic lip is double-edged.

5. The housing of claim 1, wherein the at least one integral pressure relief device is disposed proximate a bottom of said first and second housing parts.

6. A housing comprising:
a first housing part;
a second housing part, the first and second housing parts defining an interior volume therebetween;
at least one breathing bore defined in one of the first and second housing parts; and
a seal operable to seal the first housing part with respect to the second housing part, the seal comprising at least one integral pressure relief device including:
a bead portion disposed along a first side;
protuberances disposed along a second side such that air can pass between the protuberances;
at least one perforation sized to receive a retaining device to retain the at least one integral pressure relief device in place; and
an elastic lip operable as a check valve moveable to an open position by over-pressure in an interior space defined between the first and second housing parts, wherein at least one of the first and second housing parts has a groove defined therein for receiving the seal.

7. The housing of claim 1, wherein the seal comprises:
a static portion; and
a transition portion between the static portion and the elastic lip.

8. The housing of claim 7, wherein the transition portion has a substantially constant height.

9. A housing comprising:
a first housing part;
a second housing part, the first and second housing parts defining an interior volume therebetween;
at least one breathing bore defined in one of the first and second housing parts; and
a seal operable to seal the first housing part with respect to the second housing part, the seal comprising at least one integral pressure relief device including:
a bead portion disposed along a first side;
protuberances disposed along a second side such that air can pass between the protuberances;
at least one perforation sized to receive a retaining device to retain the at least one integral pressure relief device in place; and
an elastic lip operable as a check valve moveable to an open position by over-pressure in an interior space defined between the first and second housing parts,
wherein the seal comprises a static portion and a transition portion between the static portion and the elastic lip, and wherein the static portion comprises at least one knob disposed on a periphery thereof.

10. The housing of claim 7, wherein the static portion is substantially rectangular in cross section and includes a rounded side.

11. A housing assembly comprising:
a housing including a first housing part and a second housing part, the first and second housing parts defining an interior volume therebetween;
a seal encircling a periphery of the housing to seal the first and second housing parts;
at least one pressure relief device integrated into the seal, wherein the at least one pressure relief device is disposed proximate a bottom of the housing; and
at least one elastic lip integrated into the at least one pressure relief device, wherein the at least one elastic lip assumes an open position in response to an over-pressure condition within the housing; and
wherein the housing further comprises a labyrinth structure defined between the first and second housing parts that inhibits entry of liquid into the interior volume, the labyrinth structure comprising stepped portions disposed proximate the seal.

12. The housing assembly of claim 11, wherein the stepped portions are disposed proximate the seal in the region of the at least one pressure relief device.

13. The housing assembly of claim 11, wherein the at least one elastic lip has a substantially v-shaped cross section.

14. The housing assembly of claim 11, wherein the at least one pressure relief device comprises:
a bead portion disposed along a first side of the at least one pressure relief device; and
protuberances disposed along a second side of the at least one pressure relief device such that air can pass therebetween.

15. The housing assembly of claim 11, wherein the at least one pressure relief device comprises:
at least one perforation sized to receive a retaining device to retain the at least one pressure relief device in place.

16. The housing assembly of claim 11, wherein the at least one pressure relief device has a substantially semi-circular periphery.

17. A housing assembly comprising:
a housing including a first housing part and a second housing part, the first and second housing parts defining an interior volume therebetween;
a seal encircling a periphery of the housing to seal the first and second housing parts;
at least one pressure relief device integrated into the seal, wherein the at least one pressure relief device is disposed proximate a bottom of the housing; and
at least one elastic lip integrated into the at least one pressure relief device, wherein the at least one elastic lip assumes an open position in response to an over-pressure condition within the housing;
wherein the housing further includes a labyrinth structure defined between the first and second housing parts that inhibits entry of liquid into the interior volume, wherein the labyrinth structure is disposed proximate the seal, and wherein the housing further includes:
a groove for receiving the seal.

18. The housing assembly of claim 17, wherein the seal further includes:
a plurality of knobs protruding from an outer periphery of the seal, wherein the plurality of knobs being positioned against side walls in the groove to prevent the seal from becoming dislodged from the groove.

19. A housing comprising:
a housing portion including a first housing part and a second housing part the first and second housing parts defining an interior volume therebetween; and
an encircling seal for sealing the first housing part and the second housing part, wherein the seal includes:
at least one pressure relief device proximate a single side of the housing portion, wherein the at least one pressure relief device comprises:
a bead portion disposed across a back surface of the pressure relief device;
at least one protuberance disposed on a front surface of the pressure relief device, wherein the at least one protuberance is operable to pass air; and
an elastic lip operable to assume a venting position in response to over-pressure within the housing portion.

20. The housing of claim 19, wherein the elastic lip has a v-shaped cross section.

21. The housing of claim 19, wherein the elastic lip is double-edged.

22. The housing of claim 19, wherein the elastic lip is disposed from a side surface of the at least one pressure relief device that is substantially perpendicular to both the front and back surfaces.

23. A housing comprising:
a housing portion including a first housing part and a second housing part, the first and second housing parts defining an interior volume therebetween; and
an encircling seal for sealing the first housing part and the second housing part, wherein the seal includes:
at least one pressure relief device proximate a single side of the housing portion, wherein the at least one pressure relief device comprises:
a bead portion disposed across a back surface of the pressure relief device;
at least one protuberance disposed on a front surface of the pressure relief device, wherein the at least one protuberance is operable to pass air; and
an elastic lip operable to assume a venting position in response to over-pressure within the housing portion, wherein at least one of the first and second housing parts has a groove defined therein for receiving the seal.

24. The housing of claim 19, wherein the elastic lip seals against both the first and second housing parts only when in a non-venting position.

25. The housing of claim 19, wherein:
the at least one pressure relief device further comprises at least one perforation extending through the at least one pressure relief device from the front surface to the back surface; and
the housing portion further includes at least one retaining pin insertable in the at least one perforation, such that the at least one retaining pin retains the at least one pressure relief device in place.

26. The housing of claim 19, wherein the seal further includes:
a static portion; and
a transition portion between the static portion and the at least one pressure relief device.

27. The housing of claim 26, wherein the transition portion has a substantially constant height.

28. A housing comprising:
a housing portion including a first housing part and a second housing part, the first and second housing parts defining an interior volume therebetween; and
an encircling seal for sealing the first housing part and the second housing part, wherein the seal includes:
at least one pressure relief device proximate a single side of the housing portion, wherein the at least one pressure relief device comprises:
a bead portion disposed across a back surface of the pressure relief device;
at least one protuberance disposed on a front surface of the pressure relief device, wherein the at least one protuberance is operable to pass air; and
an elastic lip operable to assume a venting position in response to over-pressure within the housing portion, wherein the seal further includes a static portion and a transition portion between the static portion and the at least one pressure relief device, and wherein the static portion comprises at least one knob disposed on a periphery thereof.

* * * * *